US011893451B2

(12) United States Patent
Lee (10) Patent No.: US 11,893,451 B2
(45) Date of Patent: Feb. 6, 2024

(54) CHIP COUNTER FOR SEMICONDUCTOR CHIP-MOUNTED TAPE REEL

(71) Applicant: NANODREAM CO., LTD., Daejeon (KR)

(72) Inventor: Hyun Su Lee, Sejong-si (KR)

( * ) Notice: Subject to any disclaimer, the term of this patent is extended or adjusted under 35 U.S.C. 154(b) by 420 days.

(21) Appl. No.: 17/292,138

(22) PCT Filed: Nov. 15, 2019

(86) PCT No.: PCT/KR2019/015667
§ 371 (c)(1),
(2) Date: May 7, 2021

(87) PCT Pub. No.: WO2020/105972
PCT Pub. Date: May 28, 2020

(65) Prior Publication Data
US 2021/0397921 A1    Dec. 23, 2021

(30) Foreign Application Priority Data
Nov. 20, 2018 (KR) .......... 10-2018-0143722

(51) Int. Cl.
*G06M 1/10*        (2006.01)
*G01T 1/28*        (2006.01)
(Continued)

(52) U.S. Cl.
CPC .............. *G06M 1/101* (2013.01); *G01T 1/28* (2013.01); *G06T 7/0004* (2013.01);
(Continued)

(58) Field of Classification Search
CPC ........... G01T 1/28; G01T 1/20; G06M 1/101; G06M 1/102; G06M 1/272;
(Continued)

(56) References Cited

U.S. PATENT DOCUMENTS

2002/0090129 A1*  7/2002  Ikegaya .............. G06T 7/0002
                                                    382/149
2007/0040012 A1*  2/2007  Lin .................... G06M 1/101
                                                    235/103
(Continued)

FOREIGN PATENT DOCUMENTS

JP     H09-138203       5/1997
JP     2015-043174 A    3/2015
(Continued)

OTHER PUBLICATIONS

Translation of KR-101439245 (Year: 2014).*
(Continued)

*Primary Examiner* — Dani Fox
*Assistant Examiner* — Soorena Kefayati
(74) *Attorney, Agent, or Firm* — Antonio Ha; U.S. PATENT, LLC (57) ABSTRACT

The present invention relates to a chip counter, which transmits an X-ray beam through a tape reel around which a tape having a plurality of semiconductor chips mounted in a row therein is wound, acquires an image scattered or diffracted by the semiconductor chips, and processes the acquired image, so as to count the number of the semiconductor chips, wherein: the X-ray beam transmitted through the tape reel (1) is sensed by a fluorescent intensifying screen (60); a fluorescent light emitted from the fluorescent intensifying screen (60) according to the sensing of the X-ray beam is captured by a camera (70), so that the number of the semiconductor chips is counted from an image in which the semiconductor chips are displayed by a dotted image; and the camera (70) is protected by an X-ray beam shielding member (100: 110; 120; and 130).

9 Claims, 6 Drawing Sheets

(51) Int. Cl.
  *G06T 7/00* (2017.01)
  *H01L 21/673* (2006.01)
(52) U.S. Cl.
  CPC ............... *G06T 2207/10116* (2013.01); *G06T 2207/30148* (2013.01); *G06T 2207/30242* (2013.01); *H01L 21/67356* (2013.01)
(58) Field of Classification Search
  CPC . G06T 2207/30242; G06T 2207/30148; G06T 2207/10116; G06T 2207/330242; H01L 21/67356; H01L 21/677
  See application file for complete search history.

(56) References Cited

U.S. PATENT DOCUMENTS

2013/0022167 A1* 1/2013 Cardoso ............... G01N 23/223 378/46
2017/0043970 A1* 2/2017 Fasolino .......... G01N 23/20025
2017/0354071 A1* 12/2017 Ikeda ................... H05K 13/086

FOREIGN PATENT DOCUMENTS

| KR | 10-2009-0109657 | 10/2009 |
| KR | 10-1430965 | 8/2014 |
| KR | 101439245 B1 * | 9/2014 |
| KR | 10-1451113 | 10/2014 |
| KR | 10-1685064 | 12/2016 |
| KR | 10-2018-0067103 | 6/2018 |
| KR | 20180067103 A * | 6/2020 |

OTHER PUBLICATIONS

Translation of KR-20180067103 (Year: 2018).*
English Specification of 10-2018-0067103.
English Specification of JPH09-138203.
English Specification of 10-1451113.
English Specification of JP2015-043174A.
English Specification of 10-2009-0109657.
English Specification of 10-1430965.
English Specification of 10-1685064.

* cited by examiner

Front view of housing 10

CHIP COUNTER FOR SEMICONDUCTOR CHIP-MOUNTED TAPE REEL

TECHNICAL FIELD

The present invention relates to a chip counter that transmits an X-ray beam through a tape reel onto which a tape having multiple semiconductor chips arranged in a row is wound, obtains an image of the X-ray beam scattered or diffracted by the semiconductor chips, and process the obtained image, thereby counting the semiconductor chips.

BACKGROUND ART

A tape reel has a rolled tape with semiconductor chips thereon in a row. The semiconductor chips are taken and mounted, one by one, on the products for which they are to be used while the tape is unwound.

It is needed to count the semiconductor chips in the tape reel in storing the tape reel or putting it in a manufacturing process.

To that end, a chip counter is used.

In a conventional chip counter, the tape is rewound after counting the semiconductor chips while unwinding the tape. This is burdensome and time-consuming.

A conventional enhanced chip counter transmits X-ray beams through the tape reel and images the X-ray beams scattered or diffracted by the semiconductor chips using a detector. Such a chip counter processes the image which shows the semiconductor chips in the shape of dots and counts the dots.

Since the detector is a device capable of receiving and imaging X-ray beams, the detector is not damaged by X-ray beams, and its size is typically larger than the tape reel.

However, the detector is expensive, resultantly increasing the manufacturing costs of the chip counter. The manufacturing costs may sharply increase if the diameter of the tape reel increases.

PRIOR TECHNICAL DOCUMENTS

Patent Documents (Patent Document 1) KR 10-1430965 B1 2014.08.11.
(Patent Document 2) KR 10-1685064 81 2016.12.06.
(Patent Document 3) KR 10-2018-0067103 A 2018.06.20.

DETAILED DESCRIPTION OF THE INVENTION

Technical Problems

Therefore, the present invention aims to provide a chip counter that may reduce manufacturing costs by not using a detector and precisely count the semiconductor chips of a tape reel by stably obtaining a clear image.

Means to Address the Problems

To achieve the foregoing objects, according to the present invention, there is provided a chip counter, counting semiconductor chips 5 mounted on a tape 4 wound onto a tape reel 1 by placing the tape reel 1 on a plurality of test beds 30 and 40, inserting the test beds 30 and 40 into a sealed housing 10, allowing an X-ray beam emitted from an X-ray tube 20 inside the housing 10 to be transmitted through the tape reel 1 and react with a fluorescent intensifying screen 60, and receiving and image-processing, by a computer 80, an image obtained by capturing the fluorescent intensifying screen 60 using a camera 70 positioned behind the fluorescent intensifying screen 60, wherein the chip counter includes an X-ray beam shielding member 100 blocking the X-ray beam directed to the camera 70.

According to an embodiment of the present invention, the X-ray beam shielding member 100 includes a lead glass 110 installed between the fluorescent intensifying screen 60 and the camera 70.

According to an embodiment of the present invention, the X-ray beam shielding member 100 includes beam shielding plates 120 and 130 disposed between the X-ray tube 20 and the fluorescent intensifying screen 60 to block the X-ray beam directed to the camera 70.

According to an embodiment of the present invention, the X-ray beam shielding member 100 includes a lead glass 110 installed between the fluorescent intensifying screen 60 and the camera 70 and beam shielding plates 120 and 130 disposed between the X-ray tube 20 and the fluorescent intensifying screen 60 to block the X-ray beam directed to the camera 70.

According to an embodiment of the present invention, the beam shielding plates 120 and 130 have a diameter sized to block the X-ray beam whose radiation range includes, at least, the camera 70.

According to an embodiment of the present invention, the beam shielding plates 120 and 130 are fixed to the test beds 30 and 40.

According to an embodiment of the present invention, the beam shielding plates 120 and 130 are installed to be aligned with a central axis where the tape 4 is not wound in the tape reel 1.

According to an embodiment of the present invention, there are provided a plurality of test beds 30 and 40 spaced apart from one another between the X-ray tube 20 and the fluorescent intensifying screen 60. The beam shielding plates 120 and 130 are provided only in the test bed 40 which is closest to the fluorescent intensifying screen 60 among the plurality of test beds 30 and 40.

According to an embodiment of the present invention, the test beds 30 and 40 include fitting protrusions 121 and 131 that are to be inserted into a shaft fixing hole 3 formed in a hub in a center of the tape reel 1, on first surfaces on which the tape reel 1 is placed, and wherein the beam shielding plates 120 and 130 are fixed to surfaces opposite to the first surfaces of the test beds 30 and 40 and are integrally formed with the fitting protrusions 121 and 131.

According to an embodiment of the present invention, there are provided a plurality of test beds 30 and 40 spaced apart from one another between the X-ray tube 20 and the fluorescent intensifying screen 60.

According to an embodiment of the present invention, in the surface of the test beds 30 and 40, on which the tape reel 1 is to be placed, the surface through which the X-ray beam to be radiated in the radiation range of the fluorescent intensifying screen 60 is transmitted is surrounded by a plurality of guide protrusions 31a and 41a.

According to an embodiment of the present invention, the fluorescent intensifying screen 60 includes a plurality of marks 62 on a surface which is captured by the camera 70, and wherein a lamp 113 emitting light to the fluorescent intensifying screen 60 to illuminate the marks 62 is installed on the lead glass 110 or installed on a structure supporting the lead glass 110.

According to an embodiment of the present invention, the marks 62 have any one shape of a concentric circle, a triangle, and a check pattern.

Effects of the Invention

The present invention configured as described above may count semiconductor chips by obtaining an image for detecting the semiconductor chips using the fluorescent intensifying screen 60 and the camera 70 even without using an expensive large-area detector capable of receiving and imaging X-ray beams. Thus, the present invention may be manufactured at low costs, and may be operated for tape reels in various sizes without an increase in manufacturing cost.

Further, the present invention blocks the X-ray beams to the camera 70 using the X-ray beam shielding member 100, thus protecting the camera 70 and obtaining clear images from the protected camera 70.

According to the embodiments of the present invention, holes 33a and 43a through which the X-ray beams are transmitted at the angles corresponding to the radiation range on the fluorescent intensifying screen 60 are formed in the supporting plates 33 and 43 supporting the slide of the test beds 30 and 40, thus obtaining clearer images and increasing the accuracy of counting.

According to the embodiments of the present invention, in using the plurality of test beds 30 and 40, the maximum diameter of the tape reel 1 to be counted may be limited by the guide protrusions 31a and 41a, thus preventing misuse due to wrong selection of the test beds 30 and 40.

According to the embodiments of the present invention, it is possible to perform pre-inspection to obtain clearer images using the marks 62 and the lamp 113.

BEST MODE TO PRACTICE THE INVENTION

Figure 1:
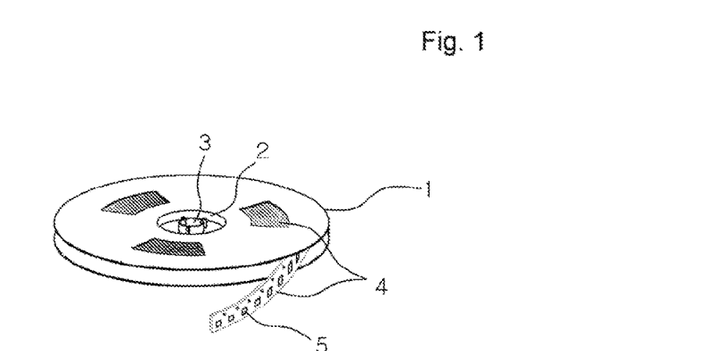
FIG. 1 is a view illustrating an example tape reel 1.

FIG. 1 is a perspective view illustrating a tape reel 1 where semiconductor chips are to be counted by a chip counter according to an embodiment of the present invention.

The tape reel 1 is a circular reel onto which a tape 4 having semiconductor chips 5 mounted thereon, spaced apart from each other, along a length direction thereof, is wound. Like a common tape reel, the tape reel 1 includes a hub 2 onto which the tape 4 is wound and a shaft fixing hole 3 formed in the center of the hub 2. A rotation shaft is inserted into the shaft fixing hole 3, and the tape 4 is unwound while the semiconductor chips 5 are taken and mounted one by one on a circuit board.

The present invention is a device for counting the semiconductor chips 5 using an image obtained by transmitting an X-ray beam through the tape reel 1 of FIG. 1.

Hereinafter, preferred embodiments of the present invention are described with reference to the accompanying drawings to be easily practiced by one of ordinary skill in the art.

Figure 2:
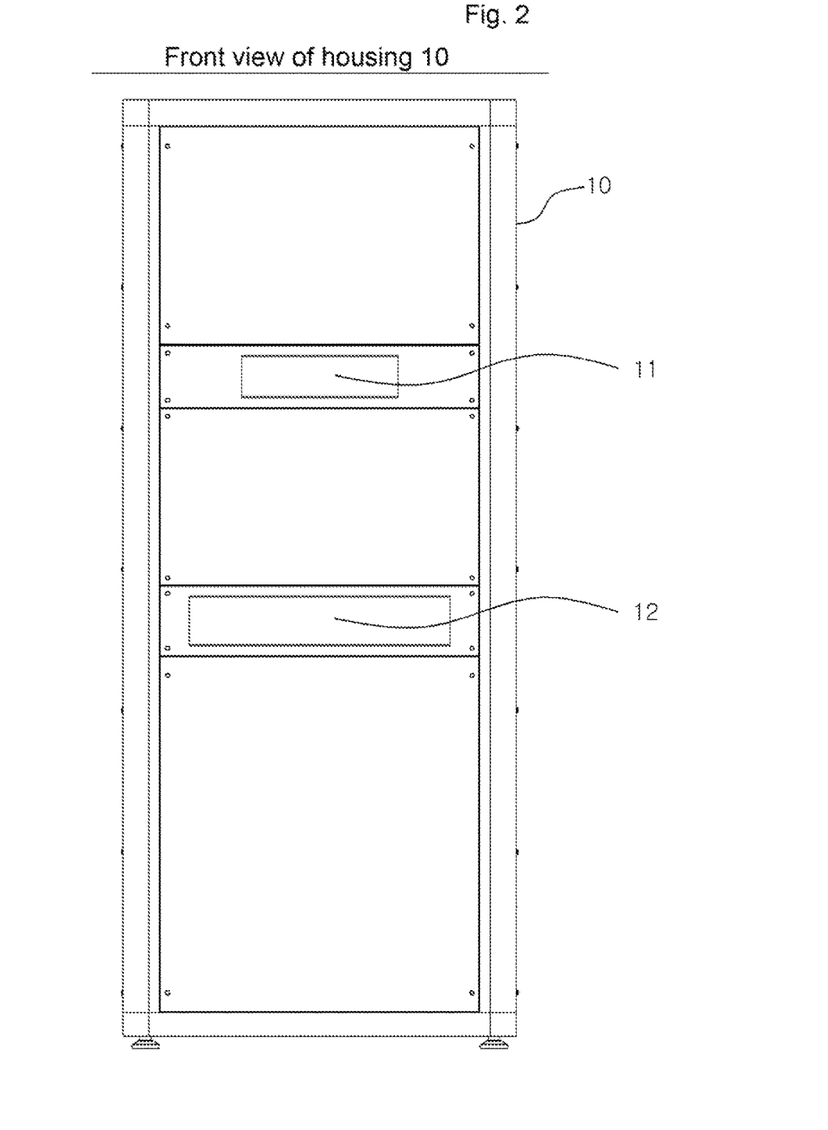
FIG. 2 is a front view of a housing 10 of a chip counter according to an embodiment of the present invention.

FIG. 2 is a front view of a housing 10 of a chip counter according to an embodiment of the present invention.

Figure 3:
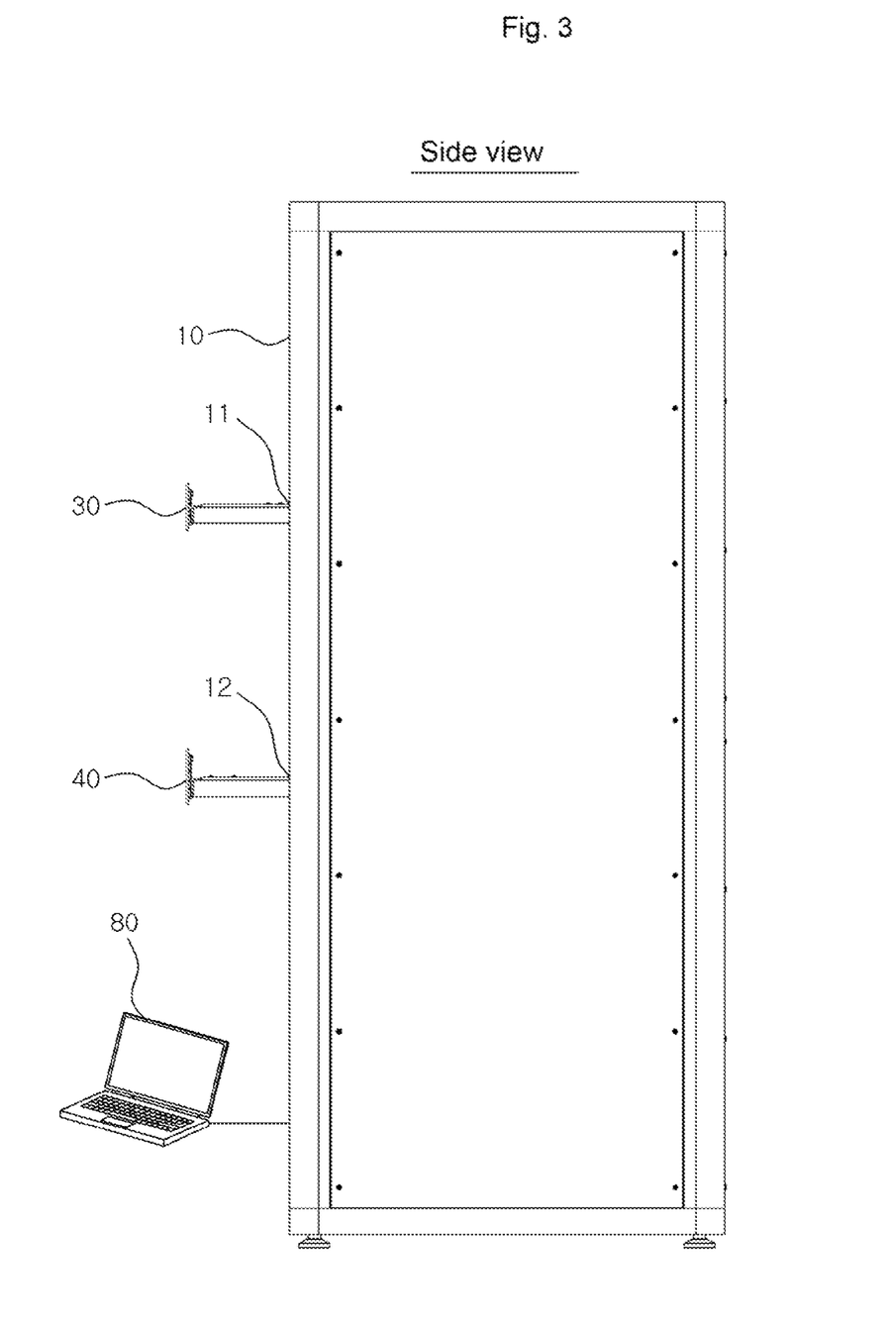
FIG. 3 is a side view of a chip counter in a state in which test beds 30 and 40 are withdrawn from a housing 10.

FIG. 3 is a side view of a chip counter in a state in which test beds 30 and 40 are withdrawn from a housing 10.

Referring to FIGS. 2 and 3, the housing 10 has slots 11 and 12 having different heights formed in the front wall. Test beds 30 and 40 are individually inserted into the slots 11 and 12. One of the test beds 30 and 40 is withdrawn to the outside of the housing 10, allows the tape reel 1 to be placed thereon, and is then inserted into the housing 10.

The inside of the housing 10 for counting the semiconductor chips 5 of the tape reel 1 placed on one of the test beds 30 and 40 is described below with reference to FIGS. 4 to 8.

Figure 4:
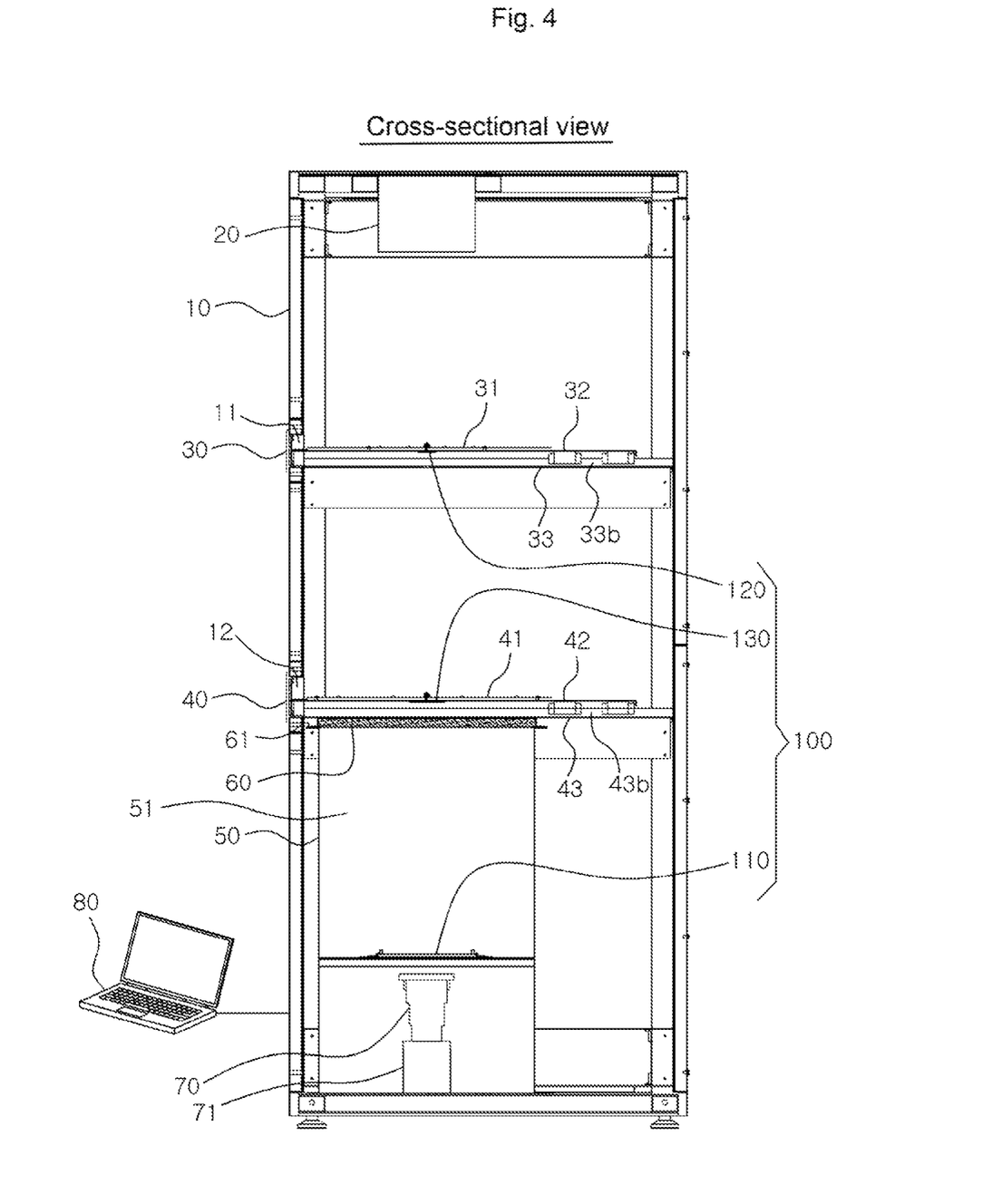
FIG. 4 is a cross-sectional view of a chip counter in which test beds 30 and 40 are inserted in a housing 10.

FIG. 4 is a cross-sectional view of a chip counter in which test beds 30 and 40 are inserted in a housing 10.

Figure 5:
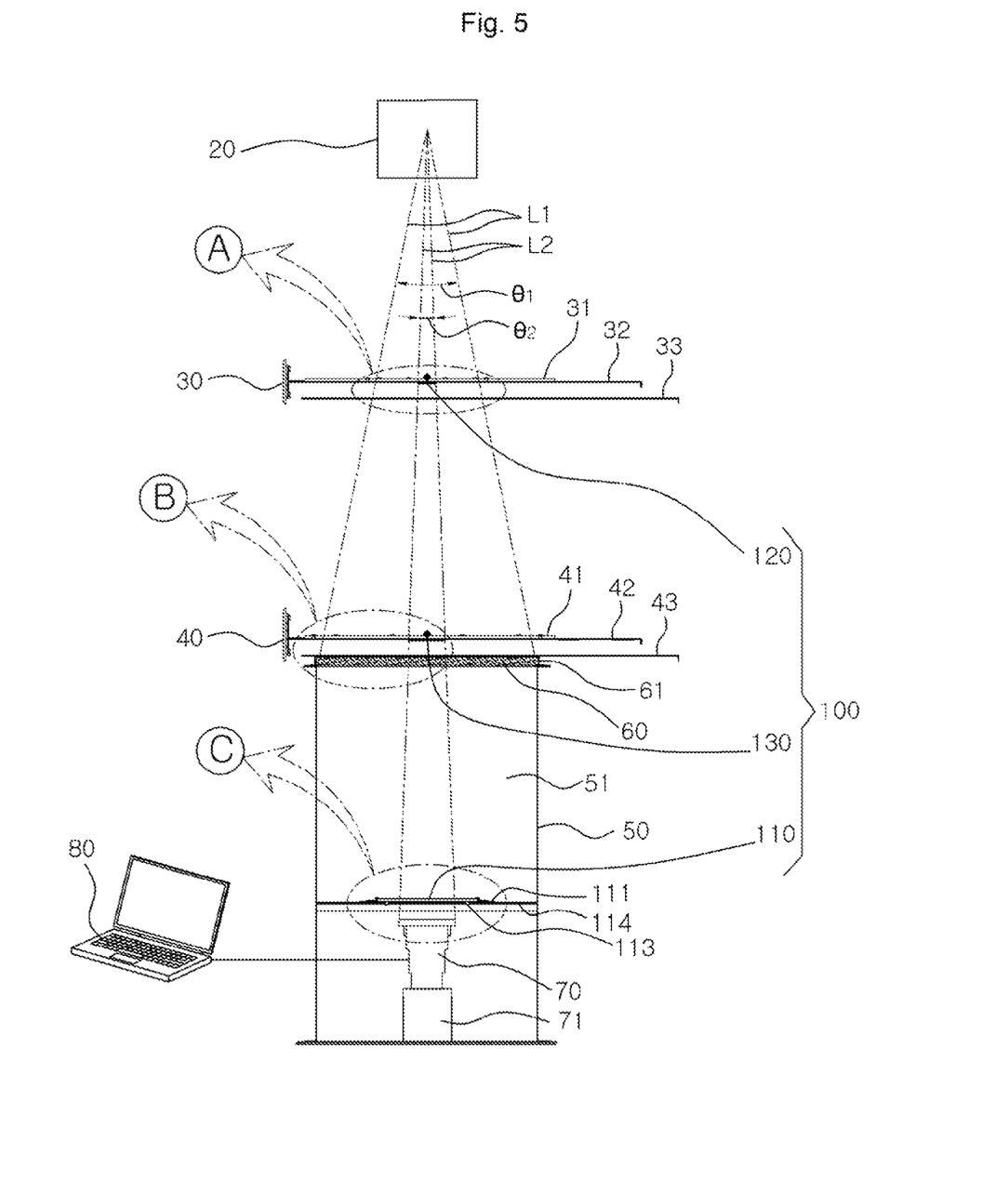
FIG. 5 is a view illustrating a component for limiting transmission of an X-ray beam and a component for obtaining an image among the components of FIG. 4.

FIG. 5 is a view illustrating a component for limiting transmission of an X-ray beam and a component for obtaining an image among the components of FIG. 4. FIG. 5 illustrates an example in which the housing 10 and rails 33b and 43b for inserting/withdrawing the test beds 30 and 40 are not shown.

Figure 6:
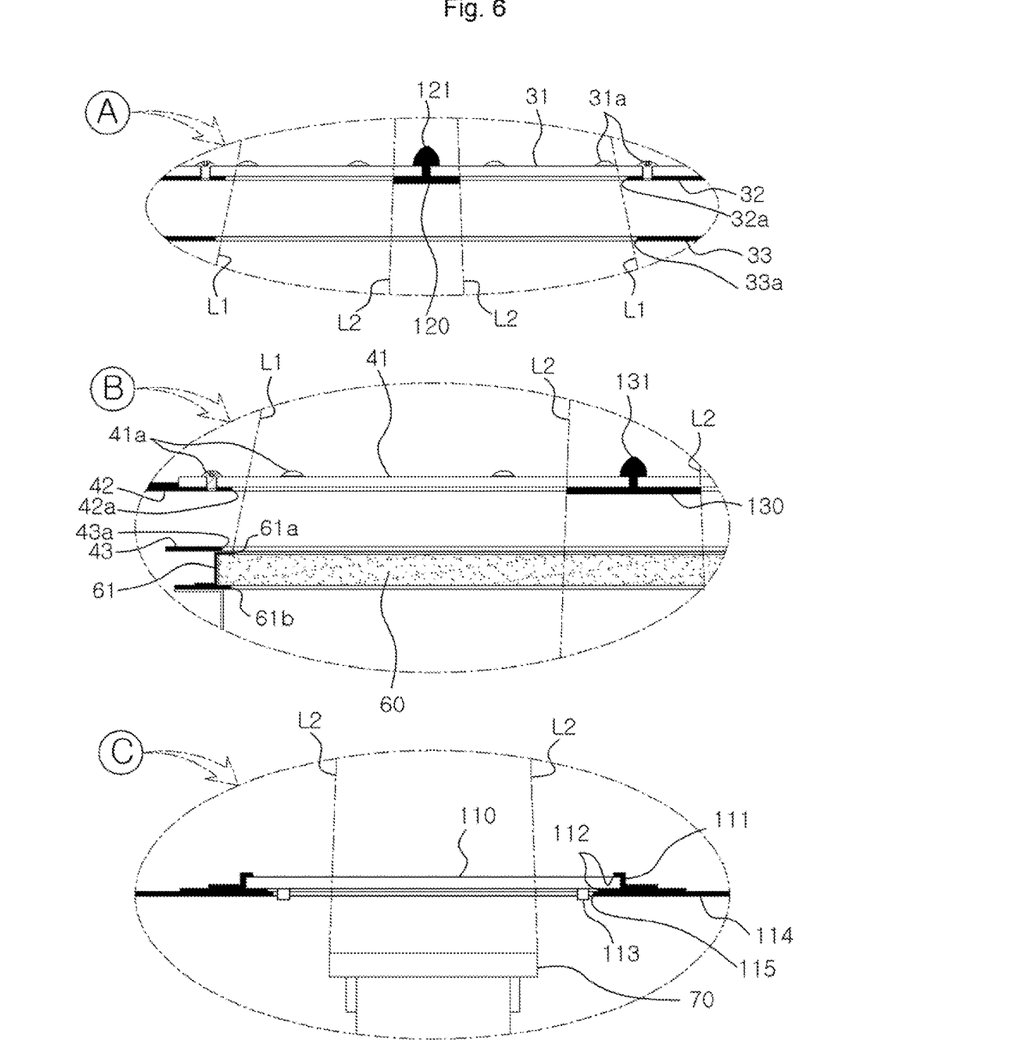
FIG. 6 is an enlarged view of a portion of FIG. 5.

FIG. 6 is an enlarged view of a portion of FIG. 5.

Figure 7:
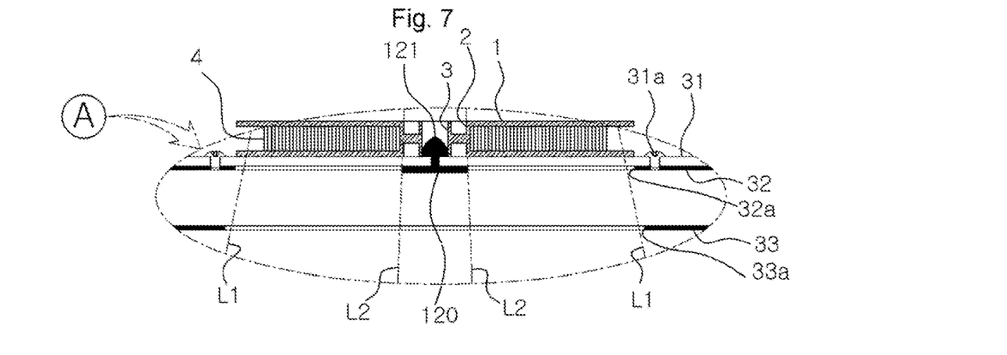
FIG. 7 is an enlarged view of a portion of an upper test bed 30 on which a tape reel 1 is placed, as an example.

FIG. 7 is an enlarged view of a portion of an upper test bed 30 on which a tape reel 1 is placed, as an example.

Figure 8:
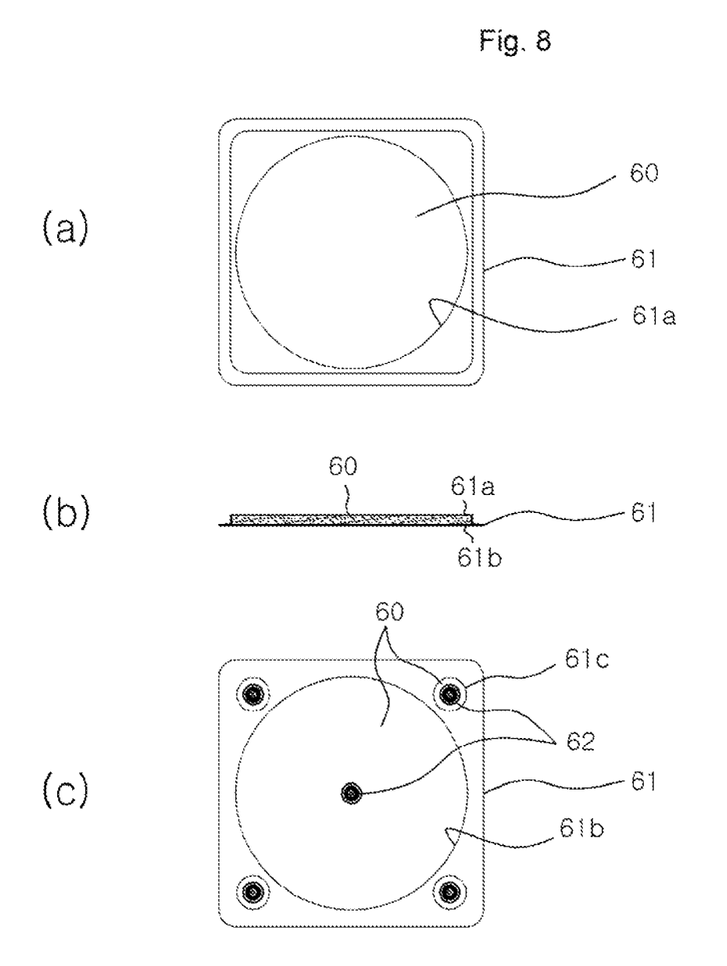
FIG. 8 illustrates a plan view (a), front view (b), and bottom view (c) of an intensifying screen installation plate 61.

FIG. 8 illustrates a plan view (a), front view (b), and bottom view (c) of an intensifying screen installation plate 61.

Referring to FIG. 4, with the test bed 30 or 40 having the tape reel 1 placed thereon positioned inside the housing 10, an X-ray beam emitted from an X-ray tube 20 is transmitted through the tape reel 1 on the test bed 30 or 40, and a fluorescent intensifying screen 60 reacts to the X-ray beam and is image-captured by a camera 70 behind the fluorescent intensifying screen 60 in a dark room atmosphere. An X-ray beam shielding member 100 may be provided to shield the X-ray beam to the camera 70 which may be damaged by X-ray beam exposure, thus protecting the camera 70 from the X-ray beam.

According to an embodiment, the X-ray beam shielding member 100 includes beam shielding plates 120 and 130 that shield the X-ray beams directly radiated to the camera 70 and a lead glass 110 that shields the X-ray beams leaking from the fluorescent intensifying screen 60.

A specific example is described below.

Referring to FIGS. 4 to 8, of the two test beds 30 and 40 which may be withdrawn through one surface (e.g., front surface) of the housing 10 having an internal space sealed off by an X-ray beam shielding material, one which fits the size of the tape reel 1, which is the target for inspection, is withdrawn, has the tape reel 1 placed thereon, and is then pushed back in. Inside the housing 10 are provided the X-ray tube 20 installed on the ceiling and a dark box 50 fixed to the bottom of the housing 10.

The open top of the dark box 50 is covered by an intensifying screen installation plate 61, thereby forming a dark room 51. Inside the dark box 50 are received a lead glass installation plate 111 and the camera 70. Although not illustrated in the drawings, the dark box 50 has the lead glass installation plate 111 and the camera 70 installed therein and, as described below, has an open/close door in the front to be able to adjust, e.g., the tilt of the camera 70. Of course, the front wall of the housing 10 may also be open.

The image captured by the camera 70 is received by a computer 80 outside the housing 10 and is analyzed to count the number of the semiconductor chips 5 of the tape reel 1.

The present invention relates to a chip counter that detects the X-ray beams disturbed by the semiconductor chips 5 through which the X-ray beams are transmitted to thereby count the semiconductor chips 5. The chip counter of the present invention does not use an expensive large-area detector for detecting X-ray beams but may rather be configured at a low cost using the fluorescent intensifying screen 60 that reacts to an X-ray beam and emits visible light and the visible light camera 70 that captures the visible light emitted from the fluorescent intensifying screen 60. Further, the camera 70 which may be damaged when exposed to an X-ray beam may be prevented from damage by shielding X-ray beams by the X-ray beam shielding member 100.

According to an embodiment of the present invention, considering that the tape reel 1 with a smaller diameter is typically used for small semiconductor chips 5, a plurality of test beds 30 and 40 are arranged at multiple levels between the X-ray tube 20 and the fluorescent intensifying screen 60 to be selectively used depending on the diameter of the tape reel 1, so as to reduce differences in the image of the fluorescent intensifying screen 60 depending on the size of the semiconductor chips 5 and increase the counting performance using image processing. Further, the X-ray beam of the radiation angle corresponding to the radiation range of the fluorescent intensifying screen 60 is allowed to pass through each test bed 30 and 40, thereby obtaining a clearer image.

Further, according to an embodiment, the camera 70 is focused on the fluorescent intensifying screen 60 so that pre-use inspection may be performed to be able to obtain an image of the visible light emitted from the fluorescent intensifying screen 60.

The components provided for the purposes are described below in detail.

The X-ray tube 20 is installed on the ceiling inside the housing 10 and radiate an X-ray beam toward the open top of the dark box 50 installed on the bottom inside the housing 10. Although not shown, a shutter for selectively emitting X-ray beams may be further provided.

The open top of the dark box 50 is covered by the intensifying screen installation plate 61 to form a dark room 51 therein. A fixed block 71 is fixed onto the internal bottom. The camera 70 is installed on the top surface of the fixed block 71 to image or capture the lower surface of the intensifying screen installation plate 61. The lead glass installation plate 111 is horizontally installed in a space between the camera 70 and the intensifying screen installation plate 61.

As shown in the enlarged view B of FIG. 6 and FIG. 8, the intensifying screen installation plate 61 receives the fluorescent intensifying screen 60 to be placed horizontally between an upper plate and a lower plate that have light transmission holes 61a and 61b, respectively, in a size of the X-ray beam radiation range in which the fluorescent intensifying screen 60 reacts to the X-ray beam. Thus, the top opening of the dark room 51 is blocked by the fluorescent intensifying screen 60. It is preferable to cover the top and bottom of the fluorescent intensifying screen 60 with glass so as to protect damage to the fluorescent intensifying screen 60.

The light transmission holes 61a and 61b which include an upper light transmission hole 61a for reaction to the X-ray beam transmitted through the circular tape reel 1 and a lower light transmission hole 61b for transmitting the visible light emitted by the reaction to the camera 70 to capture an image have circular shapes, and their centers are aligned to the optical axis of the X-ray beam emitted from the X-ray tube 20. In other words, the upper light transmission hole 61a becomes the radiation range of the X-ray beam.

A plurality of concentric circle-shaped marks 62 which may be image-captured by the camera 70 are formed on the bottom of the fluorescent intensifying screen 60 as shown in FIG. 8(c).

The bottom portions where the marks 62 are formed include a portion of the surface facing the lower light transmission hole 61b and a plurality of portions in radial positions outside the lower light transmission hole 61b. According to an embodiment of the present invention, the portion of the surface facing the lower light transmission hole 61b is a portion facing the center of the lower light transmission hole 61b.

Among the marks 62, the ones formed in the plurality of radial positions are formed close to the four vertices of the square plate-shaped fluorescent intensifying screen 60 and may be image-captured by the camera 70 through see-through holes 61c formed in the lower plate of the intensifying screen installation plate 61. Although the marks 62 are illustrated and described as having a concentric circle shape, the marks 62 may be any marks with a certain pattern, such as a triangle, a check pattern, or a square.

The lead glass installation plate 111 has a through hole 112 sized, at least, not to interfere with image-capturing the overall top opening of the dark room 51, which is blocked by the intensifying screen installation plate 61, and surrounds the edge of the lead glass 110.

The lead glass installation plate 111 is installed on a horizontal supporting plate 114 fixed to the inner wall of the dark box 50. The horizontal supporting plate 114 also has a light transmission hole 115 not to disturb the image-capturing.

The lead glass 110 is a glass that blocks X-ray beams but transmits visible light. Thus, the lead glass 110 may protect the camera 70 from X-ray beams and allows the camera 70 to obtain an image captured for the visible light resultant from reaction of the fluorescent intensifying screen 60 through the see-through hole 61c and the lower light transmission hole 61b of the intensifying screen installation plate 61 and an image captured for the plurality of marks 62 formed on the bottom of the fluorescent intensifying screen 60, without omission.

A lamp 113 is provided on the top or bottom of the lead glass 110 to emit light to the bottom of the intensifying screen installation plate 61, allowing the marks 62 to be image-captured while being illuminated. It is preferable that the lamp 113 is installed at the edge of the lead glass 110 not to interfere with the image-capturing. Since the lamp 113 may be damaged when exposed to an X-ray beam, the lamp 113 is preferably installed at the bottom edge of the lead glass 110. As another example, the lamp 113 may be installed on the lead glass installation plate 111 or horizontal supporting plate 114 which is the structure supporting the lead glass 110, but rather than on the lead glass 110. In this case, it is preferable to fix the lamp 113 to an edge portion of the light transmission hole 115 of the horizontal supporting plate 114 to be placed under the lead glass 110.

The camera 70 may capture an image of the bottom of the intensifying screen installation plate 61 through the lead glass 110. Thus, the camera 70 may obtain an image of the plurality of marks 62 on the bottom of the fluorescent intensifying screen 60 and an image of the fluorescent intensifying screen 60 seen through the lower light transmission hole 61b of the intensifying screen installation plate 61, while the lamp 113 shines on.

The camera 70 is fixed in position by the fixed block 71 installed on the bottom of the dark room 51.

The camera 70 is also aligned with the optical axis of the X-ray beam emitted from the X-ray tube 20.

There are provided a plurality of test beds 30 and 40 at different heights between the X-ray tube 20 and the fluorescent intensifying screen 60.

The test beds 30 and 40 may be installed to slide in or out through the slots 11 and 12 of the housing 10 along the rails 33b and 43b on the supporting plates 33 and 43 horizontally installed inside the housing 10. The test bed 30 or 40 may slide out, have the tape reel 1 placed thereon, and then slid in the housing 10. When the test beds 30 and 40 positioned inside, the slots 11 and 12 of the housing 10 may be closed by the externally exposed portions of the test beds 30 and 40, sealing off the inside of the housing 10.

The supporting plates 33 and 43 have through holes 33a and 43a.

The holes 33a and 43a of the supporting plates 33 and 43 allow the X-ray beam to pass in the radiation range limited by the upper light transmission hole 61a of the intensifying screen installation plate 61 in the fluorescent intensifying screen 60 as shown in FIGS. 5 and 6.

In other words, the radiation angle 61 of the X-ray beam to be radiated in the radiation range of the fluorescent intensifying screen 60 is limited to the solid angle determined by the radiation lines L1 towards the boundary of the upper light transmission hole 61a of the intensifying screen installation plate 61. The holes 33a and 43a of the supporting plates 33 and 43 need to be circular holes that have their boundary in the positions where the radiation lines L1 pass towards the boundary of the upper light transmission hole 61a, at least.

Referring to FIGS. 5 and 6, to describe a specific embodiment, the holes 33a and 43a of the supporting plates 33 and 43 are formed to be slightly larger in size than the holes defined by the positions which the radiation lines L1 pass through. This is intended to address the issue that the X-ray beam may be disturbed by, e.g., the scattering, diffraction, or reflection at the boundaries of the holes 33a and 43a and thus causes a noise image in the image obtained by the camera 70. The larger size may be appropriately determined depending on the thickness of the supporting plates 33 and 43.

The test beds 30 and 40 may be formed of a material that may transmit X-ray beams and, according to an embodiment of the present invention, may be formed by fixing a sealing plate 31 formed of a material capable of transmitting X-ray beams on a rigid base plate 32 so as to prevent damage or warping. The base plate 32 is preferably formed of a material that may block X-ray beams and has a hole 32a or 42a obtained by cutting along the portion met by the radiation lines L1 of the radiation angle θ1 of the X-ray beam, but to be slightly larger to prevent influence by disturbance at the cut line, like the holes 33a and 43a of the supporting plates 33 and 43.

The hole 32a or 42a of the base plate 32 of the test bed 30 or 40 and the hole 33a or 43a of the supporting plate 33 or 43 is circular, is positioned on the optical axis of the X-ray beam emitted from the X-ray tube 20, and is formed according to the radiation angle θ1 of the radiation range of the fluorescent intensifying screen 60. Thus, the hole 32a or 42a has a smaller diameter as it becomes closer to the X-ray tube 20.

The seating plates 31 and 41 of the test beds 30 and 40 when positioned inside the housing 10, i.e., in the state in which the semiconductor chips of the tape reel 1 are to be counted, are described. Fitting protrusions 121 and 131 and beam shielding plates 120 and 130 are provided in portions of the seating plates 31 and 41, which face the centers the holes 33a and 43a of the supporting plates 33 and 43, i.e., portions through which the optical axis of the X-ray beam passes, and a plurality of guide protrusions 31a and 41a are provided outside the portions facing the edge-side circular boundaries of the holes 33a and 43a.

The fitting protrusions 121 and 131 are protrusions to be fitted into the shaft fixing hole 3 formed in the hub 2 of the tape reel 1.

The guide protrusions 31a and 41a are ones for projecting and showing the holes 33a and 43a formed in the supporting plate 33 on the top surface of the test beds 30 and 40 and are formed to be spaced apart to surround the outer periphery of the projection area. Thus, the tape reel 1 which has a size equal to or smaller than the diameter of the area surrounded by the guide protrusions 31a and 41a may be placed on the test bed 30 or 40. In other words, the guide protrusions 31a and 41a allow the surface for transmitting the X-ray beam to be radiated in the radiation range of the fluorescent intensifying screen 60 to be surrounded, rendering it possible to know the size of the tape reel 1 to be placed on the test bed 30 or 40.

The beam shielding plates 120 and 130 are provided on the bottoms of the fitting protrusions 121 and 131 so as to have a diameter in which they are aligned with the central axis of the tape reel 1, where the tape is not wound, while blocking the beams directed to, at least, the camera 70.

As a specific embodiment, the radiation range is determined depending on the size of the camera 70 when the X-ray beam emitted from the X-ray tube 20 is radiated to the camera 70. Thus, the radiation angle 62 is determined according to the radiation lines L2 that are directed to the boundary of the circular radiation range with respect to the camera 70, and the circular beam shielding plates 120 and 130 that have the portions reached by the radiation lines L2 as their outer peripheries are mounted.

Like the beam shielding plates 120 and 130, the fitting protrusions 121 and 131 are formed of a material that may block X-ray beams, and the fitting protrusions 121 and 131 are integrally formed with the beam shielding plates 120 and 130.

As the plurality of test beds 30 and 40 have different heights, they have the beam shielding plates 120 and 130 that have a smaller diameter as they become closer to the X-ray tube 20.

The beam shielding plates 120 and 130 may have a smaller diameter than the hub 2 of the tape reel 1.

The beam shielding plate 120 or 130 may be installed only on the test bed 40 which is closest to the dark box 50 and positioned lowest among the plurality of test beds 30 and 40. In other words, although the tape reel 1 is placed only on any one of the plurality of test beds 30 and 40, it is required to radiate the X-ray beam after inserting all the test beds 30 and 40 in the housing 10 to seal off the inside of the housing 10.

Thus, even when the beam shielding plate 130 is installed only on the test bed 40 which is positioned lowest, the direct beam to the camera 70 may be blocked.

As the so-configured test bed 30 or 40 is inserted in the housing 10, with the tape reel 1 placed thereon, to allow it to be positioned between the X-ray tube 20 and the dark box 50, the X-ray beam emitted from the X-ray tube 20 may be transmitted through the tape reel 1 on the test bed 30 or 40 to the fluorescent intensifying screen 60 disposed to block the top opening of the dark room 51. The X-ray beam which is scattered or diffracted by the semiconductor chips when passing through the tape reel 1 reacts to the fluorescent intensifying screen 60 in the form of dots, and the camera 70 directed upwards in the dark room 51 captures the fluorescent intensifying screen 60 through the lead glass 110 installed between the fluorescent intensifying screen 60 and the camera 70, thereby obtaining a visible light image showing the presence of the semiconductor chips in the form of dots.

The marks 62 and the lamp 113 are provided to be able to inspect whether the camera 70 is placed on the normal line to the fluorescent intensifying screen 60 while focusing on the fluorescent intensifying screen 60.

The user may identify the image resultant from capturing the marks 62 while the lamp 113 is on, on the computer 80, pre-inspect the arrangement of the camera 70 and the fluorescent intensifying screen 60 using the image, and, if they are not properly arranged, adjust the position and angle of the camera 70 by the fixed block 71.

Thereafter, the user may place the tape reel 1 on the test bed suitable for the size of the tape reel 1 among the plurality of test beds 30 and 40 and operate the X-ray tube 20 and the camera 70. In this case, the computer 80 may receive the image captured by the camera 70, image-process the received image, and count the number of the dots, thereby obtaining the number of the semiconductor chips of the tape reel 1.

The sealing structures (ceiling, walls, and bottom) of the housing 10, the base plates 32 and 42 and supporting plates 33 and 43 of the test beds 30 and 40, the sealing structures of the dark box 50, and the intensifying screen installation plate 61 may be formed of a material that may block X-ray beams.

The seating plates 31 and 41 of the test beds 30 and 40 may be formed of a material that may transmit X-ray beams.

Thus, it is possible to radiate the X-ray beam whose radiation range is limited to the upper light transmission hole 61a of the intensifying screen installation plate 61 by the holes 33a and 43a of the supporting plates 33 and 43. The X-ray beam scattered or diffracted by the semiconductor chips while passing through the tape reel 1 on the test bed 30 may react with the fluorescent intensifying screen 60, generating visible light.

The camera 70 may capture and obtain an image of the semiconductor chips as represented in the form of dots, using the visible light.

In other words, it is possible to obtain a clear visible light image for detecting the presence of the semiconductor chips of the tape reel 1 and count the semiconductor chips using the fluorescent intensifying screen 60 and the camera 70 which are inexpensive.

The X-ray beams which may be directed to the camera 70 may be blocked by the shielding plates 120 and 130, and the X-ray beams which may be scattered, diffracted, reflected, and transmitted through the fluorescent intensifying screen 60 to the camera 70 may be blocked by the lead glass 110. As such, the camera 70 may be protected from X-ray beams by dual shielding of the beam shielding plates 120 and 130 and the lead glass 110.

Although not shown in the drawings, a switch may be provided to control the operation of the X-ray tube 20, the lamp 113, and the camera 70, or the operation of the X-ray tube 20, the lamp 113, and the camera 70 may be controlled by the computer 80. Preferably, there may be provided a safety switch that prevents the X-ray tube 20 from radiating an X-ray beam upon withdrawing the test bed 30 or 40 to place the tape reel 1 on the test bed 30 or 40.

| [Legend of Symbols] | | |
|---|---|---|
| 1: tape reel | 2: hub | 3: shaft fixing hole |
| 4: tape | 5: semiconductor chip | |
| 10: housing | 11: upper slot | 12: lower slot |
| 20: X-ray tube | | |
| 30: upper test bed | 31: seating plate | 31a: guide protrusion |
| 32: base plate | 32a: hole | 33: supporting plate |
| 33a: hole | 33b: rail | |
| 40: lower test bed | 41: seating plate | 41a: guide protrusion |
| 42: base plate | 42a: hole | 43: supporting plate |
| 43a: hole | 43b: rail | |
| 50: dark box | 51: dark room | |
| 60: fluorescent intensifying screen | 61: intensifying screen installation plate | 61a, 61b: light transmission hole |
| 61c: see-through hole | 62: mark | |
| 70: camera | 71: fixed block | |
| 80: computer | | |
| 100: X-ray beam shielding member | | |
| 110: lead glass | 111: lead glass installation plate | 112: light transmission hole |
| 113: lamp | 114: horizontal supporting plate | 115: light transmission hole |
| 120, 130: beam shielding plate | 121, 131: fitting protrusion | |

The invention claimed is:

1. A chip counter configured to count semiconductor chips (5) mounted on a tape (4) wound onto a tape reel (1) by placing the tape reel (1) on a plurality of test beds (30 and 40), the chip counter comprising:
a sealed housing containing
the tape reel;
the plurality of test beds;
a fluorescent intensifying screen;
an X-ray tube configured to transmit an X-ray beam through the tape reel which reacts with the fluorescent intensifying screen;
a camera positioned behind the fluorescent intensifying screen and configured to obtain an image by detecting the X-ray beam that is transmitted through the tape reel and fluorescent intensifying screen; and an X-ray shielding member that blocks the X-ray beam directed to the camera, wherein the plurality of test beds are arranged between the X-ray tube and the fluorescent intensifying screen, and wherein the X-ray tube and the camera are configured to obtain an image; and a computer configured to receive and image-process the image.

2. The chip counter of claim 1, wherein the X-ray beam shielding member (100) includes a lead glass (110) installed between the fluorescent intensifying screen (60) and the camera (70).

3. The chip counter of claim 1, wherein the X-ray beam shielding member (100) includes beam shielding plates (120 and 130) disposed between the X-ray tube (20) and the fluorescent intensifying screen (60) to block the X-ray beam directed to the camera (70).

4. The chip counter of claim 1, wherein the X-ray beam shielding member (100) includes:

a lead glass (110) installed between the fluorescent intensifying screen (60) and the camera (70); and beam shielding plates (120 and 130) disposed between the X-ray tube (20) and the fluorescent intensifying screen (60) to block the X-ray beam directed to the camera (70).

5. The chip counter of claim 2, wherein the fluorescent intensifying screen (60) includes a plurality of marks (62) on a surface which is captured by the camera (70), and wherein a lamp (113) emitting light to the fluorescent intensifying screen (60) to illuminate the marks (62) is installed on the lead glass (110) or installed on a structure supporting the lead glass (110).

6. The chip counter of claim 3, wherein the beam shielding plates (120 and 130) have a diameter sized to block the X-ray beam whose radiation range includes, at least, the camera (70).

7. The chip counter of claim 3, wherein the beam shielding plates (120 and 130) are installed to be aligned with a central axis where the tape (4) is not wound in the tape reel (1).

8. The chip counter of claim 3, wherein the test beds (30 and 40) include fitting protrusions (121 and 131) that are to be inserted into a shaft fixing hole (3) formed in a hub in a center of the tape reel (1), on first surfaces on which the tape reel (1) is placed, and wherein the beam shielding plates (120 and 130) are fixed to surfaces opposite to the first surfaces of the test beds (30 and 40) and are integrally formed with the fitting protrusions (121 and 131).

9. The chip counter of claim 5, wherein the marks (62) have any one shape of a concentric circle, a triangle, and a check pattern.

* * * * *